United States Patent [19]
Dell et al.

[11] Patent Number: 5,996,096
[45] Date of Patent: *Nov. 30, 1999

[54] DYNAMIC REDUNDANCY FOR RANDOM ACCESS MEMORY ASSEMBLIES

[75] Inventors: Timothy Jay Dell, Cochester; Mark William Kellogg, Essex Junction, both of Vt.

[73] Assignee: International Business Machines Corporation, Armonk, N.Y.

[*] Notice: This patent issued on a continued prosecution application filed under 37 CFR 1.53(d), and is subject to the twenty year patent term provisions of 35 U.S.C. 154(a)(2).

[21] Appl. No.: 08/749,583

[22] Filed: Nov. 15, 1996

[51] Int. Cl.⁶ .................................................. G01R 31/28
[52] U.S. Cl. ............................................. 714/710; 714/41
[58] Field of Search .................................. 371/10.2, 10.3, 371/21.6, 22.5, 25.1, 37.3, 37.8, 40.13, 48; 365/200, 201; 395/182.01, 182.04, 182.05, 183.18; 714/1, 2, 3, 5, 6, 7, 25, 36, 41, 47, 48, 710, 711, 758

[56] References Cited

U.S. PATENT DOCUMENTS

| | | | |
|---|---|---|---|
| 4,992,984 | 2/1991 | Busch et al. | 365/200 |
| 5,199,033 | 3/1993 | McGeoch et al. | 371/10.1 |
| 5,265,054 | 11/1993 | McClure | 365/200 |
| 5,265,055 | 11/1993 | Horiguchi et al. | 365/200 |
| 5,297,086 | 3/1994 | Nasu et al. | 365/200 |
| 5,315,552 | 5/1994 | Yoneda | 365/200 |
| 5,323,348 | 6/1994 | Mori et al. | 365/200 |
| 5,325,334 | 6/1994 | Roh et al. | 365/201 |
| 5,392,246 | 2/1995 | Akiyama et al. | 365/200 |
| 5,414,660 | 5/1995 | Sugibayashi et al. | 365/200 |
| 5,416,740 | 5/1995 | Fujita et al. | 365/200 |
| 5,502,333 | 3/1996 | Bertin et al. | 257/685 |
| 5,524,231 | 6/1996 | Brown | 395/428 |
| 5,640,353 | 6/1997 | Ju | 365/200 |
| 5,644,541 | 7/1997 | Siu et al. | 365/200 |
| 5,675,543 | 10/1997 | Rieger | 365/200 |
| 5,677,880 | 10/1997 | Horiguchi et al. | 365/200 |
| 5,684,746 | 11/1997 | Oowaki et al. | 365/200 |

FOREIGN PATENT DOCUMENTS

| | | |
|---|---|---|
| 2290892 | 1/1996 | United Kingdom . |
| 2290894 | 1/1996 | United Kingdom . |
| 2291992 | 2/1996 | United Kingdom . |
| WO95/35573 | 12/1995 | WIPO . |

Primary Examiner—Ly V. Hua
Assistant Examiner—Nadeem Iqbal
Attorney, Agent, or Firm—Whitham, Curtis & Whitham; Robert A. Walsh

[57] ABSTRACT

Reduced specification DRAMs are used in memory assemblies in such a way as to maximize the use of the good cells in the reduced specification DRAM chips. An external memory array is mapped to replace defective memory locations on a real time basis. The major components are (1) a non-volatile storage device, (2) a logic device, and (3) a volatile storage device. The non-volatile storage device, such as an EPROM, EEPROM, or a flash memory chip, is used to retain address information for all memory fails on a given assembly. In simpler implementations, the use of specific combinations of RAM failure types can be used in addition to a logic decode chip, with the raw card identifying to the decode chip the failing address information (via solder jumpers). The logic device is an ASIC or programmable logic device which contains the bit steering logic and timing generation logic to redirect defective RAM addresses to an alternate storage device for all read and write operations. The volatile storage device is a RAM array that is used to replace failing address locations in the original reduced specification memory. This array may be in the form a static random access memory (SRAM or DRAM) array, resident in the logic device described above. The size of the device determines the amount of failing addresses that can be allowed in the reduced specification memory.

33 Claims, 15 Drawing Sheets

| DEFECTIVE ADDRESS | DEFECTIVE RAM POSITION | ASIC REPLACEMENT ADDRESS |
|---|---|---|
| ⋮<br>MULTIPLE ENTRIES, $0-*2^N$<br>⋮ | **ONE ENTRY PER ADDRESS | ONE ENTRY PER ADDRESS RAM POSITION |

FIG.4

| DEFECTIVE ADDRESS | DEFECTIVE BIT POSITION | ASIC REPLACEMENT ADDRESS |
|---|---|---|
| ⋮<br>MULTIPLE ENTRIES, $0-*2^N$<br>⋮ | ***ONE ENTRY PER ADDRESS | ONE ENTRY PER ADDRESS+BIT LOCATION |

DYNAMIC REDUNDANCY FOR RANDOM ACCESS MEMORY ASSEMBLIES

BACKGROUND OF THE INVENTION

1. Field of the Invention

The present invention generally relates to random access memory (RAM) assemblies and, more particularly, to dynamic redundancy for RAM assemblies using reduced specification RAM chips where only bad cells or locations are replaced on a real time basis rather than replacing an entire quadrant of a RAM chip.

2. Background Description

In the manufacture of dynamic random access memories (DRAMs), individual chips are tested as part of the manufacturing process. Inevitably, some of the chips will fail certain tests. Rather than simply discarding these chips, they are identified as reduced specification memory ("yield loss"). l)RAM chips are typically composed of a plurality of banks of memory arrays, and if a failure occurred in, say, two banks of an eight bank l)RAM chip, the chip would be identified as a three quarter reduced specification memory.

DRAM shortages, coupled with a never-ending supply of reduced specification memory, drive the need to re-use reduced specification memory in computer applications. Current industry practices are to utilize reduced specification DRAM chips as "partially good" RAM chips, generally in the data dimension, and use additional DRAM chips to replace defective bits. This technique, while making use of "partially good" chips, is generally wasteful in that a RAM chip with only one or more cells bad will be downgraded to a three quarter or one half good device, rather than simply replacing the defective cells.

SUMMARY OF THE INVENTION

It is therefore an object of the present invention to provide a way to more effectively use reduced specification RAM chips in memory assemblies.

It is another object of the invention to provide a RAM assembly which maximizes the use of reduced specification RAM chips.

According to the invention, an external memory array is mapped to replace defective memory locations on a real time basis. The major components in the implementation of the invention are (1) a non-volatile storage device, (2) a logic device, and (3) a volatile storage device. The non-volatile storage device, such as an electronically programmable read only memory (EPROM), a electronically erasable and programmable read only memory (EEPROM), or a flash memory chip, is used to retain address information for all memory fails on a given assembly. In simpler implementations, the use of specific combinations of RAM failure types can be used in addition to a logic decode chip, with the raw card identifying to the decode chip the failing address information (via solder jumpers). The logic device is an application specific integrated circuit (ASIC) or programmable logic device which contains the bit steering logic and timing generation logic to redirect defective RAM addresses to an alternate storage device for all read and write operations. The logic device can be designed to include a non-volatile portion (e.g., flash memory). The volatile storage device is a RAM array that is used to replace failing address locations in the original reduced specification memory. This array may be in the form a static random access memory (SRAM) array or DRAM array, resident in the logic device described above. The size of the device limits the amount of failing addresses that can be allowed in the reduced specification memory.

BRIEF DESCRIPTION OF THE DRAWINGS

The foregoing and other objects, aspects and advantages will be better understood from the following detailed description of a preferred embodiment of the invention with reference to the drawings, in which:

FIG. 4 is a memory map of the ASIC shown in FIG. 2;

FIG. 8 is a memory map of the ASIC shown in FIG. 7;

DETAILED DESCRIPTION OF A PREFERRED EMBODIMENTS OF THE INVENTION

The preferred embodiments of the invention will now be described. In the examples described, tradeoffs have been made to minimize the complexity of the logic circuitry, as well as the EPROM size, in an effort to eliminate compatibility concerns of the final assembly and maximize flexibility to accommodate emerging DRAM functions (extended data out (EDO), burst EDO (BEDO), synchronous DRAM (SDRAM)). Although the examples apply to a 72 pin single in-line memory module (SIMM), the concepts described are easily extended to cover other assemblies and/or data widths.

Figures 1A, 1B:
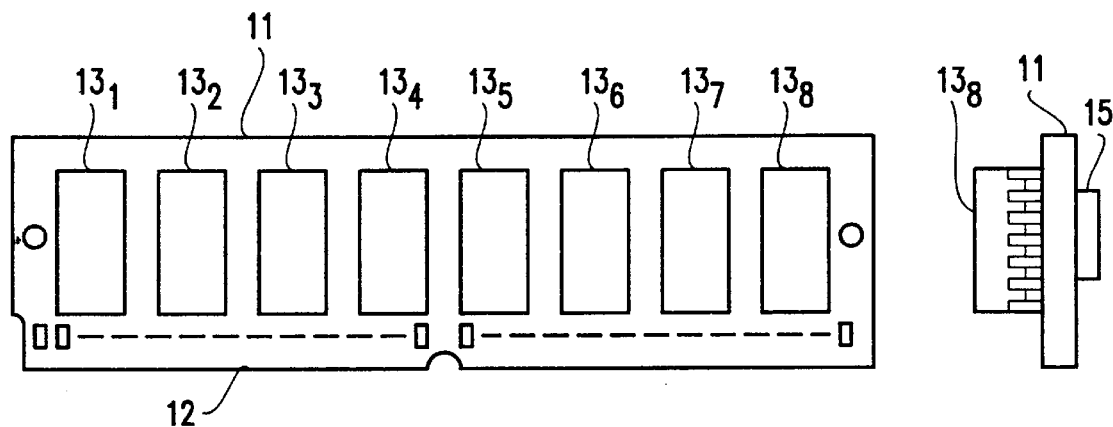
FIGS. 1A, 1B and 1C are, respectively, front, side and back views of a 4 M×32 SIMM DRAM assembly with dynamic redundancy on 4-bit boundaries according to a preferred embodiment of the invention.
Figure 1C:
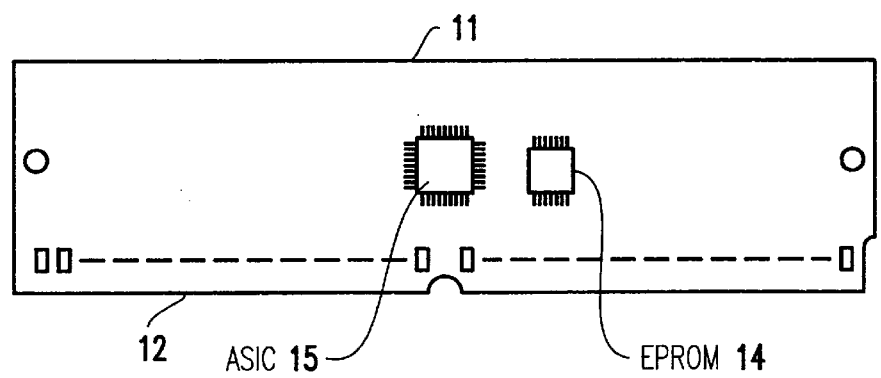

Referring now to the drawings, and more particularly to FIGS. 1A, 1B and 1C, there is shown a 72 pin SIMM comprising a printed circuit board (PCB) 11 with a plurality of electrical contacts 12 (72 in the example) along one edge. A plurality of reduced specification DRAM chips $13_1$ to $13_8$ are mounted on the front of the PCB 11. Mounted on the back of the PCB 11 are an EPROM 14, and a logic circuit implemented in an ASIC 15. A replacement array macro is incorporated into the ASIC 15 and is used to replace failing address locations in the DRAM chips. In the preferred embodiment of the invention, the replacement array (SRAM or DRAM array) is implemented in the ASIC. This improves performance by eliminating driver, receiver and wiring delays.

Figure 2:
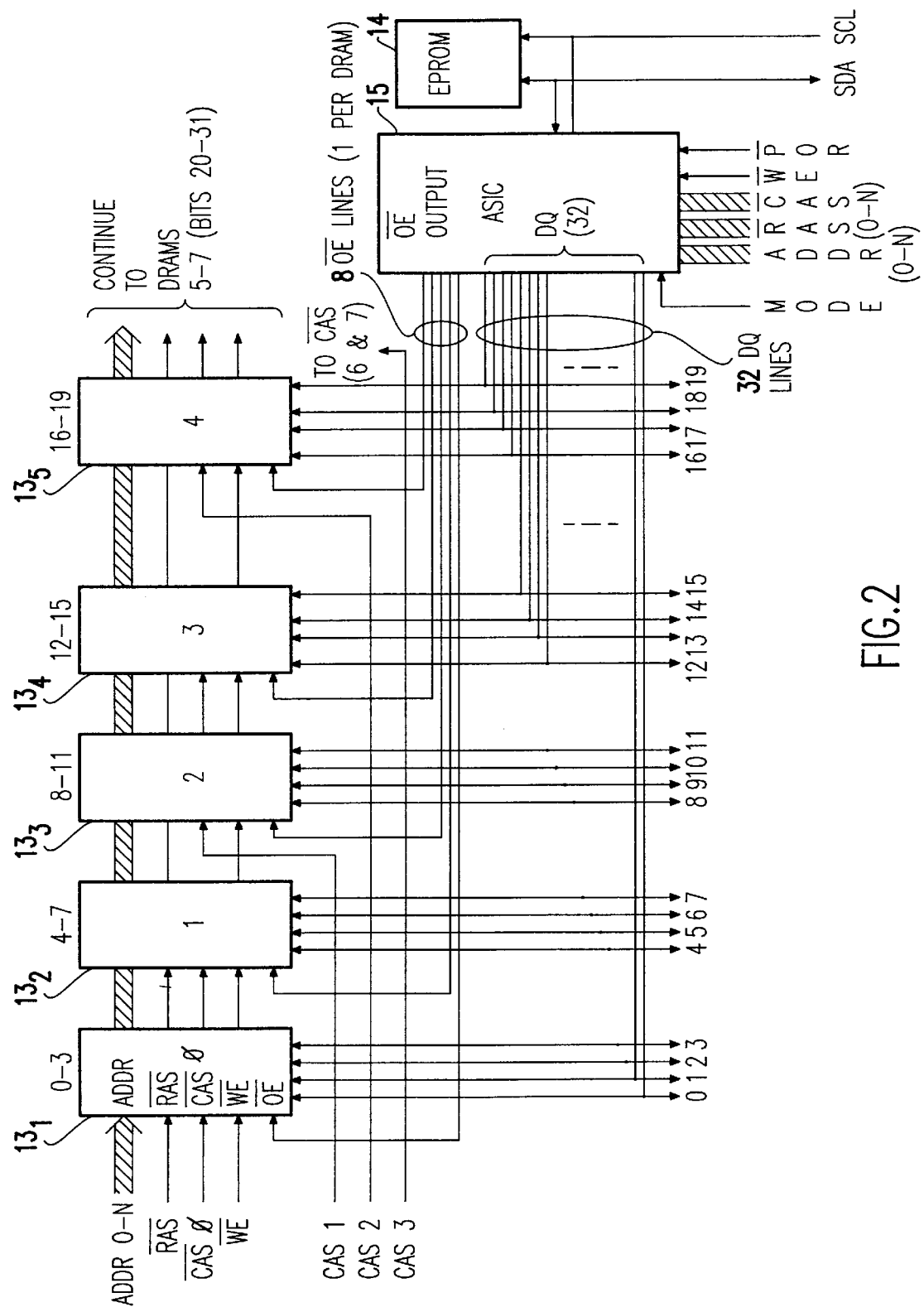
FIG. 2 is a functional block diagram showing the relationship of the principle components of the DRAM assembly shown in FIGS. 1A, 1B and 1C.

FIG. 2 shows the functional block diagram of the embodiment of FIGS. 1A, 1B and 1C. This implementation uses ×4 DRAM chips in one bank, five of the eight chips being shown in the figure. The input to the ASIC 15 are 32 bidirectional data (DQ) lines, four from each of the DRAM chips $13_1$ to $13_8$, the address (ADDR), row address strobe ($\overline{RAS}$), column address strobe ($\overline{CAS}$), write enable ($\overline{WE}$), power on reset ($\overline{POR}$) mode and the serial EPROM data (SDA) and clock (SCL).

Figure 3:
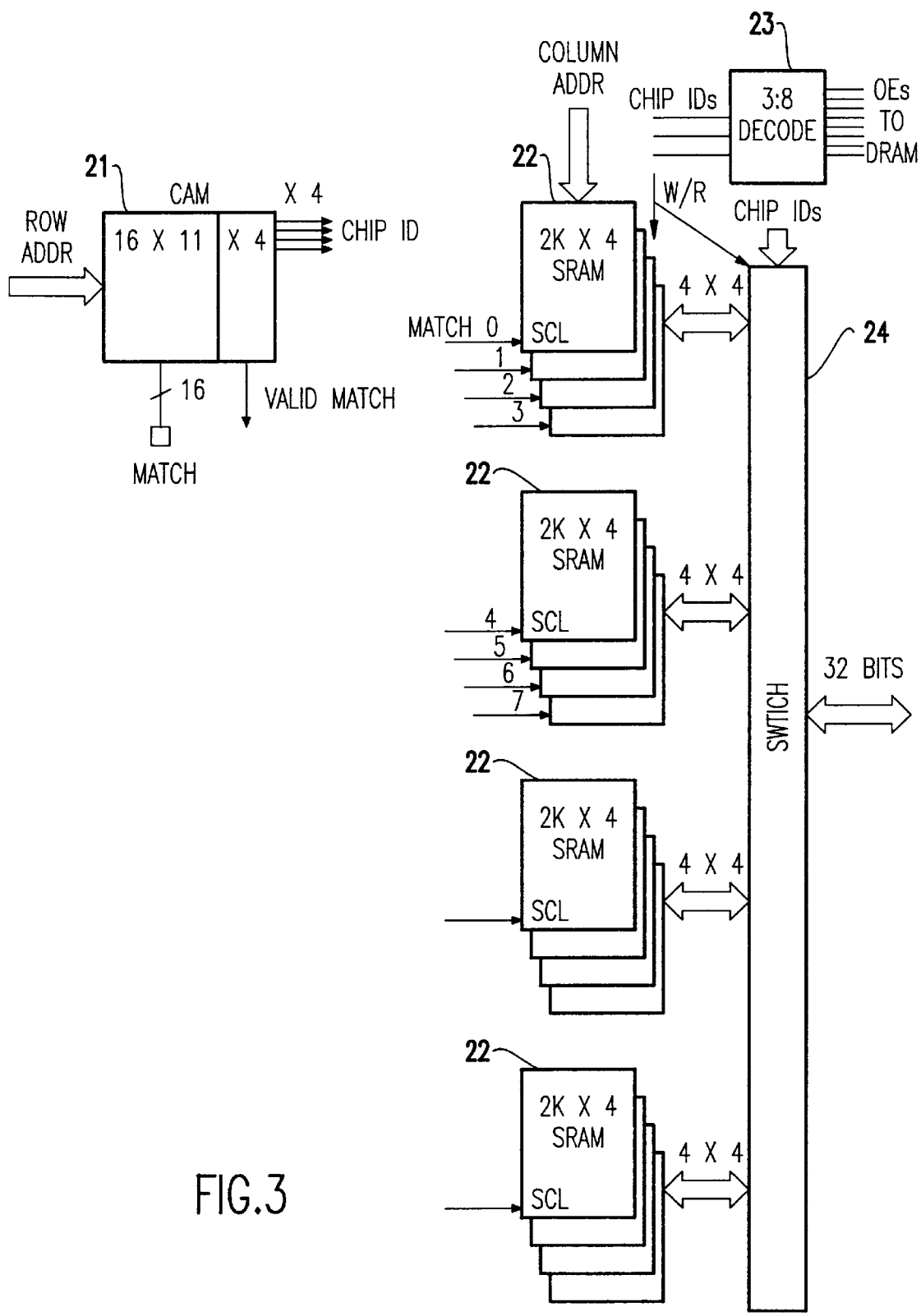
FIG. 3 is a block diagram showing in more detail the ASIC shown in FIG. 2.

FIG. 3 is a block diagram showing in more detail the ASIC 15 in FIG. 2. At RAS time, the row address is latched and sent to one of sixteen locations by 11-bit content addressable memory (CAM) 21 with a 4-bit tag register. The CAM is programmed with up to sixteen failing addresses, and each failing address has a "valid" flag bit and 3-bit chip identification (ID). If the CAM 21 indicates a match between the row address and one of the sixteen location in the CAM, the CAM 21 outputs a match signal on one of its sixteen match lines. In addition, the tag bits indicate (1) if the match is valid, i.e., the address was set by the system during programming and is not just a match of random data, and (2) the 3-bit (one through eight binary) chip ID of the failing chip, i.e., which location on the SIMM has the bad data at the specified row address. The 3-bit chip ID is decoded by a 3-to-8 decoder 23, the output of which is an inverse output enable ($\overline{OE}$) signal that is active on a single one of eight output lines. This $\overline{OE}$ signal goes to one of the eight DRAM chips $13_1$ to $13_8$ (FIG. 2) to inhibit the output of that DRAM chip. The activated match line, qualified by the valid match signal, is used as a select to one of the sixteen 2 K×4 fast SRAM arrays 22. The column address is used as an index into the selected array for each column access that occurs on a given row. The output of the selected array is gated onto a larger multiplexer, or switch 24, which connects to any of the thirty-two data bits and replaces the faulty DRAM read data with the correct data from the SRAM. A write operation works exactly the same, except the data flows into the selected SRAM from the system.

The ASIC 15 can be programmed to operate in two access (read) modes. The first mode is a fast page mode in which the ASIC drives I/O bit(s) starting at the fall of the column address strobe (during reads) until the column address strobe rises. The second mode is an extended data out (EDO) mode in which the ASIC drives I/O bit(s) starting at the fall of the column address strobe and continues until the column address strobe falls again or write enable falls.

FIG. 4 shows the address map in the ASIC 15 for 4-bit boundaries. This map includes entries for defective addresses. There are multiple defective address entries, 0 to $2^N-1$, where $2^N$ is the total number of addresses of the memory chip. There are also entries for defective RAM position, one entry per address. On a ×32 SIMM, 0–7 if a single bank SIMM, and 0–15 if a double bank SIMM. Finally, there are entries for ASIC replacement addresses, one entry per address and RAM position.

This first embodiment is implemented as 4×DRAMs in one bank. A two bank implementation would have additional row address strobe lines wired from the ASIC. An implementation using ×8 DRAMs would have one output enable ($\overline{OE}$) per eight bits, This embodiment provides a low cost solution with certain tradeoffs. Specifically, a failing cell, word line (WL) or bit line (BL) can be replaced, but only across all DQs on a given DRAM chip.

Figure 5A:
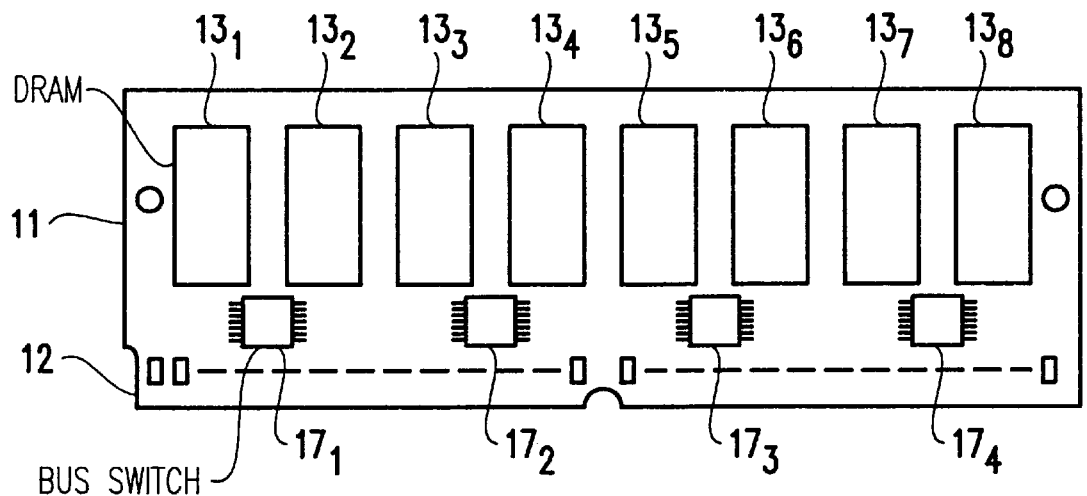
FIGS. 5A and 5B are, respectively, front and back views of a 4 M×32 SIMM DRAM assembly with dynamic redundancy on single bit boundaries according to a preferred embodiment of the invention.
Figure 5B:
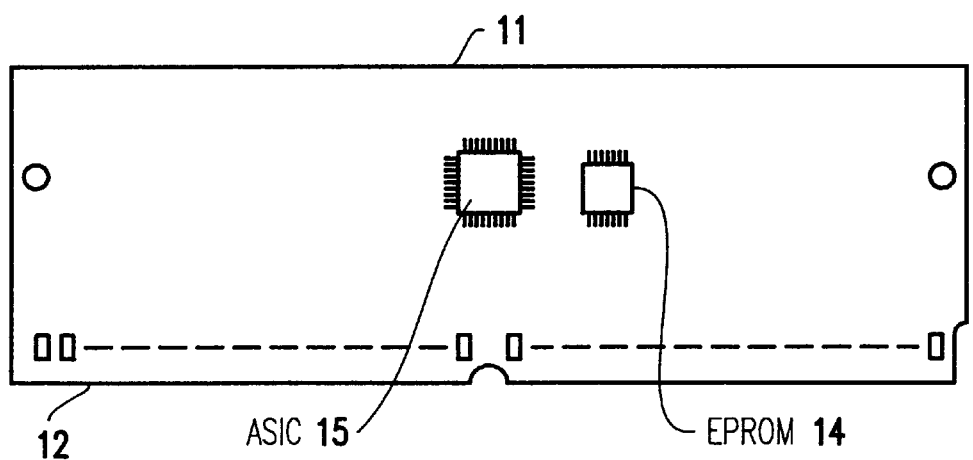

FIGS. 5A and 5B show an alternate embodiment. As in the first embodiment, the implementation is a 4 M×32 SIMM but the dynamic redundancy is on single bit boundaries. This embodiment requires four bus switches $17_1$ to $17_4$, as particularly shown in FIG. 5A.

Figure 6:
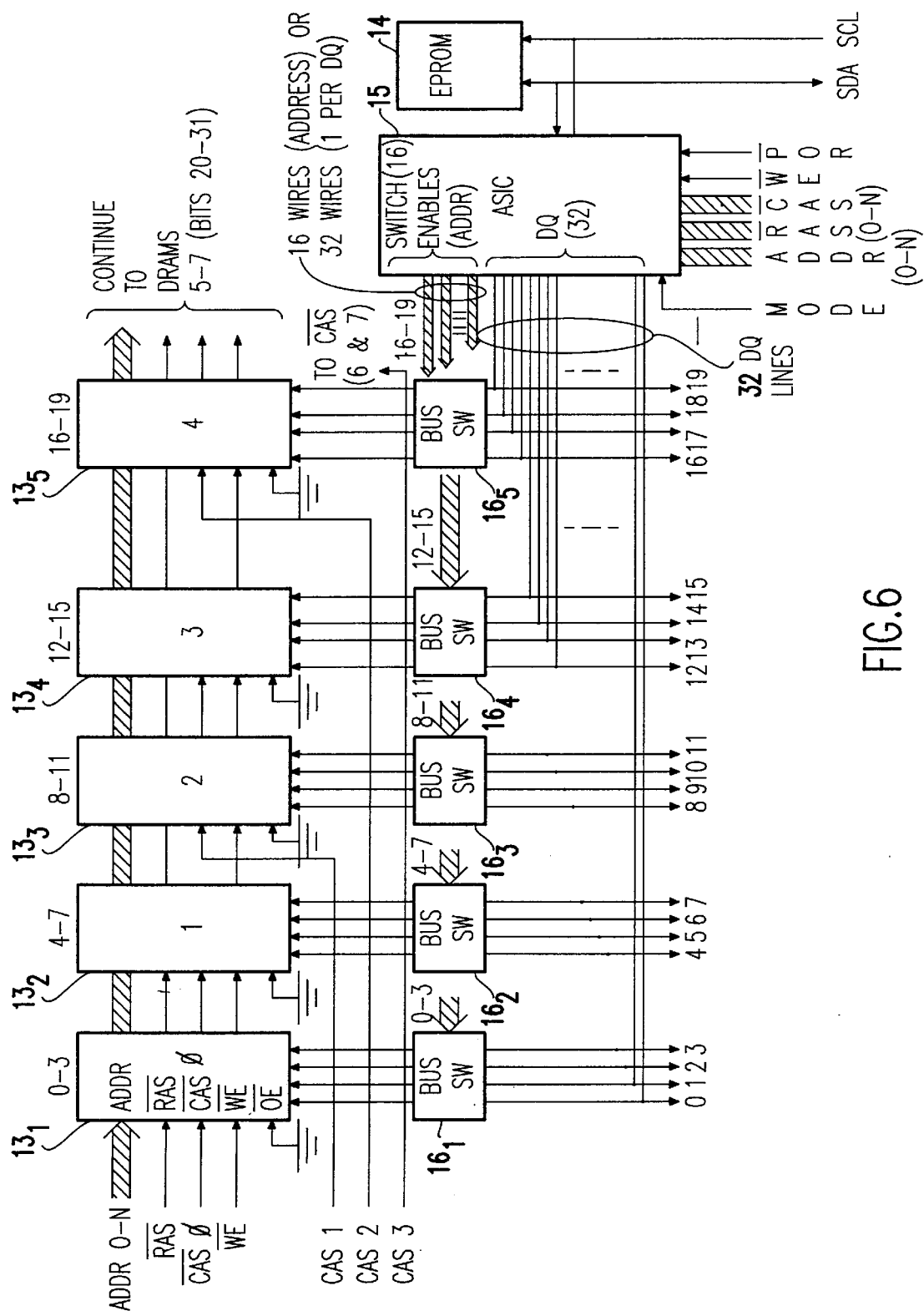
FIG. 6 is a functional block diagram showing the relationship of the principle components of the DRAM assembly shown in FIGS. 4A and 4B.

FIG. 6 shows the block diagram of the second embodiment. This embodiment allows substitution of an individual bit rather than a group of four bits. Again, the problem is not on a write, where data can be written to both the ASIC and the DRAM, but on a read, where the ASIC and DRAM both try to drive the system bus, the ASIC with the correct data and the DRAM with the incorrect data. In order to isolate the ASIC and DRAM data drivers, some kind of switch is needed, However, because a typical multiplexer that one would normally use incurs a delay of at least several nanoseconds, its use is precluded. The solution is to put a bus switch device in between the DRAMs and the system bus. A good choice would be the SN74CBT3126 Quadruple Bus Switch from Texas Instruments. This device, when enabled, connects the DRAM to the system bus with a sub-nanosecond delay. When disabled, it totally isolates the DRAM so it does not interfere with the ASIC.

Figure 7:
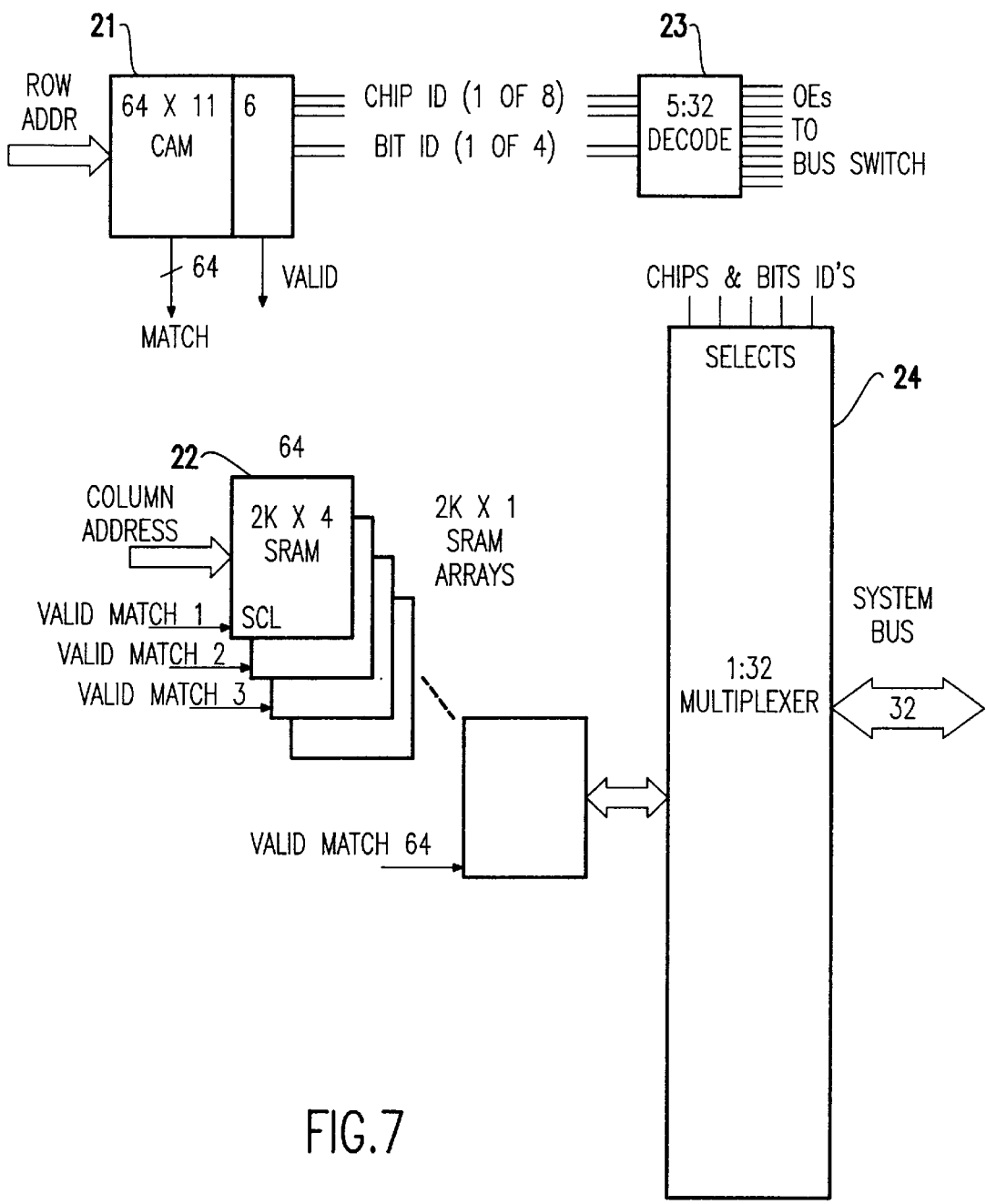
FIG. 7 is a block diagram showing in more detail the ASIC shown in FIG. 6.

As shown in FIG. 7, the ASIC structure is slightly different for this embodiment. The CAM 21 is now 64×11 with a 6-bit tag. Because only a single bit is to be replaced, the fast SRAMs 22 are configured as 2 K×1, and there are now sixty-four of them instead of sixteen. The first tag bit is still the "valid" bit, and the next three tag bits are still the chip ID bits. The additional two bits point to which of the four bits of the bus switch needs to be disabled.

As with the first embodiment, the 11-bit row address is presented to the CAM 21. If that row address is found in nay of the sixty-four locations, the appropriate valid match signal is generated. At the same time, the chip ID and bit ID associated with the address is gated out to the output enable decoder and steering logic 23. A column address then indexes the selected 2 K×1 SRAM array. Each new column address under the same row address is gated out of the SRAM. The output of the SRAM goes to a 1 to 32-bit multiplexer 24, which connects the SRAM output to the appropriate bit of the system bus. This is selected by the 5-bit field of the chip IDs plus the bit IDs. This 5-bit field is also used to enable (bring out of tri-state) the ASIC driver while disabling (put into tri-state) the DRAM driver by turning off one of the thirty-two output enable lines going to the bus switches. A write operation works similarly, except that the tri-state control is not needed.

FIG. 8 is the address map for the ASIC 15 for single bit boundaries in the embodiment shown in FIG. 6. AS in the address map in FIG. 4, this map includes entries for defective addresses. There are multiple defective address entries 0 to $2^N-1$, where $2^N$ is the total number of addresses of the memory chip. There are also entries for defective bit positions, one entry per address; on a ×32 SIMM, they are 0–31. Finally, there are entries for ASIC replacement addresses, one entry per address and bit position.

The implementation of the second embodiment is shown for ×4 DRAMs in a single bank. A two bank implementation would have additional row address strobes (dotted DQs at the DRAM side). A ×8 DRAM implementation and other options can be implemented in a similar fashion. The function of the four bus switches is implemented with direct selection (e.g., one enable per bit). This embodiment minimizes SRAM/ASIC size and can be applied to fast DRAMs and SDRAMs.

These 72- pin SIMMs are assembled using reduced specification DRAMs, with no special care as to the failure types. AT SIMM test, failing memory locations are identified for each memory device, and stored by the test system. The ideal case is to store defective addresses, by device serial number, at device test. SIMM test is not capable of some of the complex testing required to find all device fails; therefore, the preferred embodiment identifies fails at device test. Upon test completion, the test system loads the failing addresses into the EPROM 14 or other non-volatile storage device to create a memory map of the failing addresses. In these embodiments, the failing address consists of the following:

10 to 11 bit address to identify the row address associated with the failing location(s)
All failing addresses in the defined row are replaced.
For DRAM chips having more than 22 addresses (11/11), additional bits are required.
3 to 4 bits to identify the failing DRAM position.
On a ×32 SIMM using ×4 DRAM chips, three bits are needed to decode one of eight possible DRAM chips in a given bank. A fourth bit can be used to identify the bank in which the fail resides (i.e., bank 1 or 2). Wider input/output (I/O) assemblies, assemblies built with other RAM widths or assemblies having more banks require more or less bits.

Hence, in this example, 13 to 15 bits are required for each fail. If each DRAM chip has only one failing segment, this would require a non-volatile device having 15 bits×16 DRAM locations (a two bank SIMM)=240 cells. This can be obtained with a 256 cell device costing less than $0.50 in quantity.

The logic device, implemented as an ASIC in these embodiments, includes a SRAM macro configured to directly replace up to eight failing RAM segments. This requires eight SRAM segments, each four bits in width and matching the depth of the RAM column address field (1024 or 2048 addresses). For a one bank assembly, eight SRAM segments of 2048×4 are required for an 11/11 addressed DRAM (65 K SRAM total). In addition, the following circuitry is needed:

A power-up detection circuit similar to that used in the ECC-On-SIMM (ECC is error correction code) product is used to detect the assembly has been powered-up. Upon power-up, and prior to normal operation, this circuit activates logic to transfer the non-volatile memory information.

A non-volatile storage transfer circuit generates a clock signal to the non-volatile memory. The non-volatile memory information is loaded into the address translation registers in the ASIC to allow for the remapping of memory fails during operation. Once the full non-volatile memory address depth has been reached (based on a counter in the ASIC), the transfer is concluded.

RAM data re-mapping circuitry is implemented as an ASIC device and dotted directly to the RAM devices (all DQs) as well as the address bus, RAS, CAS, WE and OE signals. For every access to this assembly, a valid RAS results in the row address being latched and compared to the stored "failing" address locations. In a match is obtained, during CAS time any "write" operations to the memory will be stored into the SRAM locations mapped to replace the defective memory device, in addition to being stored into the defective array location. For "read" operations, the SRAM is accessed similarly, but drives the data bus instead of the defective memory device. In this case, the failing memory will be de-gated via the ASIC activating the OE signal to the defective device only.

Figure 9A:
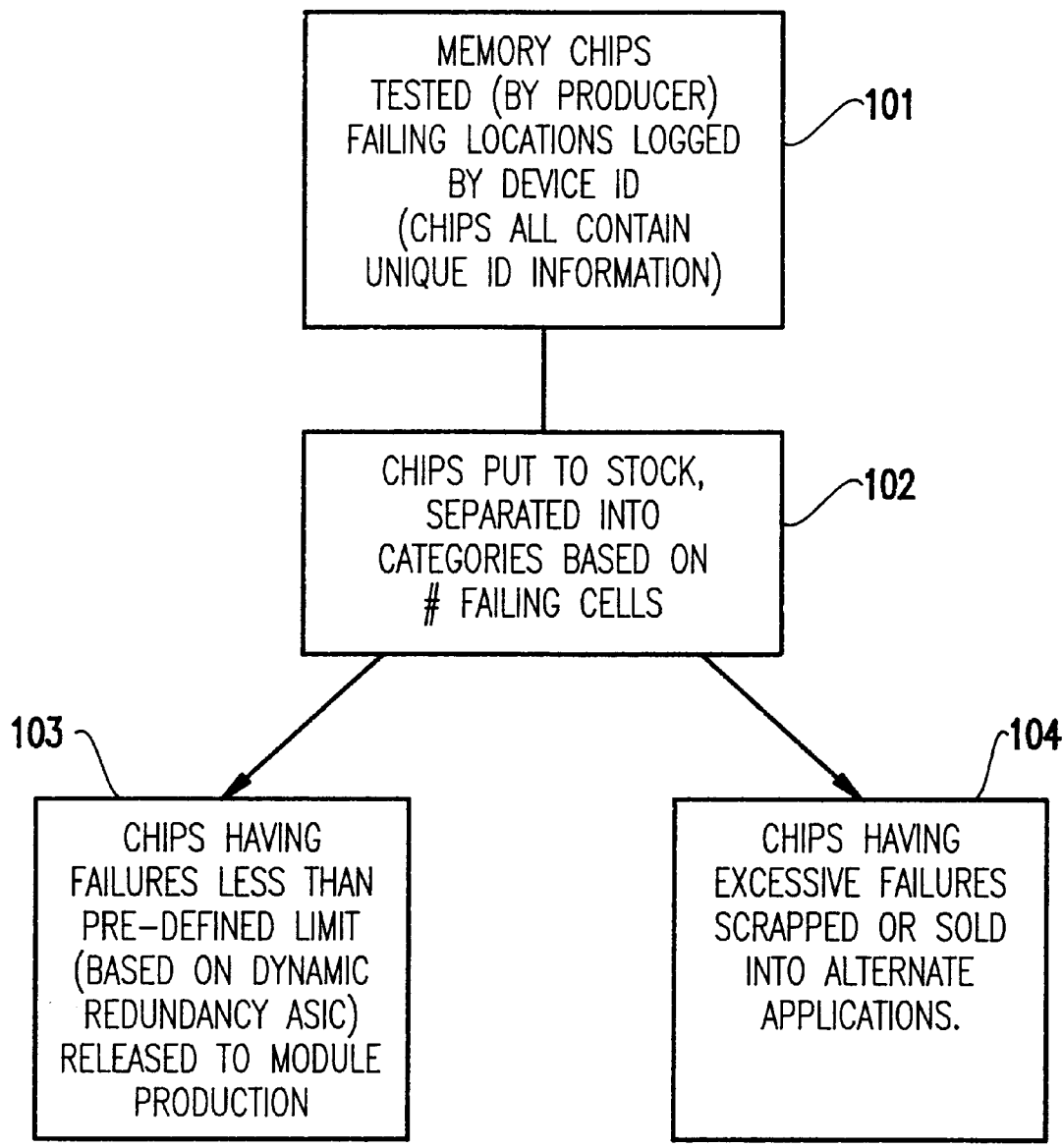
FIGS. 9A to 9E are flow diagrams showing the process of RAM production, assembly and testing according to the invention.

Referring now to FIGS. 9A to 9E, the processes of production, assembling and testing the DRAM assemblies is illustrated by way of flow diagrams. In FIG. 9A, the process of RAM production is shown. The memory chips are first tested by the producer in function block 101. Failing locations are logged by device identification (ID). The tested chips are put in stock, separated into categories based on number of failing cells in function block 102. Chips having failures less than a pre-defined limit (based on RAM size in dynamic redundancy ASIC) are released to module production in function block 103. Chips having excessive failures are scrapped or sold into alternative applications in function block 104.

Figure 9B:
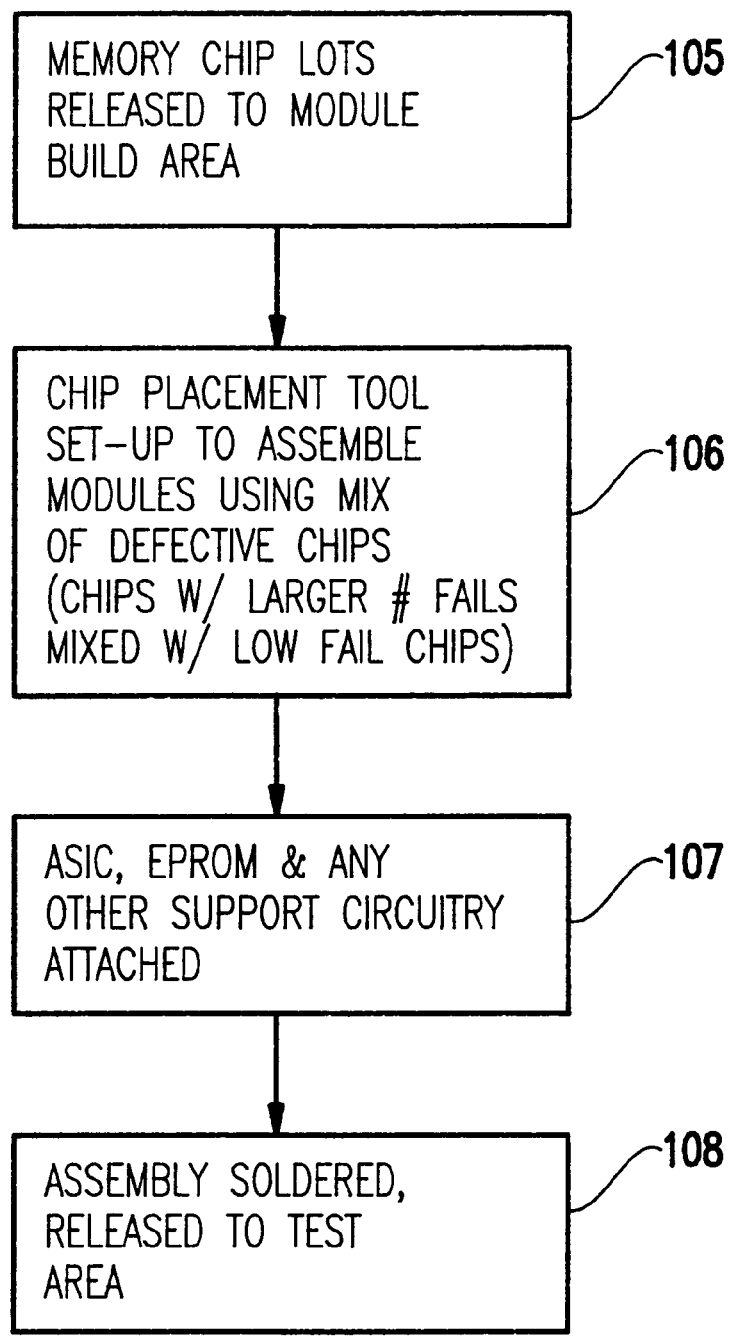

In FIG. 9B, the process of module assembly is shown. Those chips released to module production are released to the module build area in function block 105. A chip placement tool is set up to assemble modules using a mix of defective chips in function block 106. The ASIC, EPROM and other support circuitry are attached to the PCB in function block 107. The assembly is then soldered and released to the test area in function block 108.

Figure 9C:
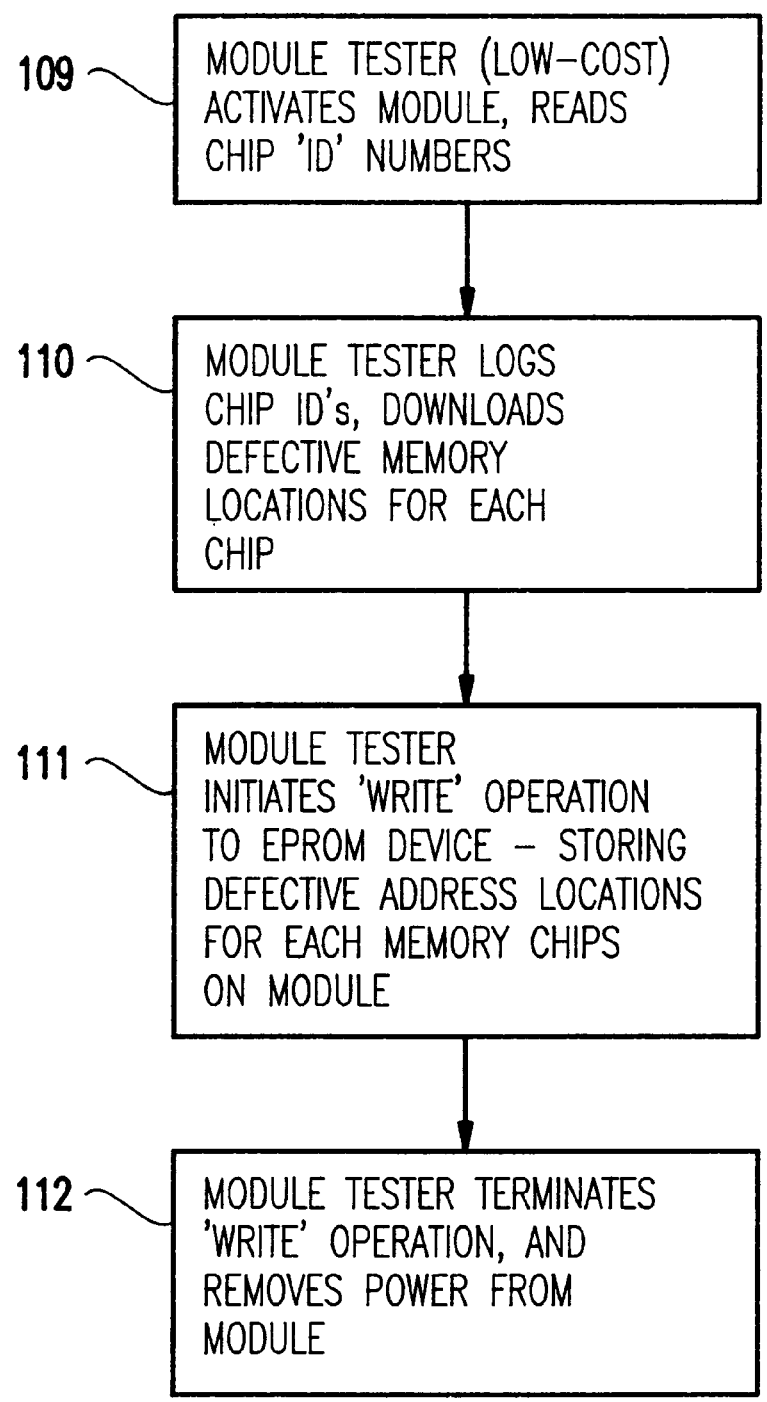

In FIG. 9C, the process of module programming is shown. The module tester activates the module in function block 109 and reads the chip ID number. The module tester logs chip ID numbers and downloads defective memory locations for each chip in function block 110. The module tester then initiates a "write" operation to the EPROM device, storing defective address locations for each memory chip on the module in function block 111. The module tester terminates the "write" operation in function block 112 and removes power from the module.

Figure 9D:
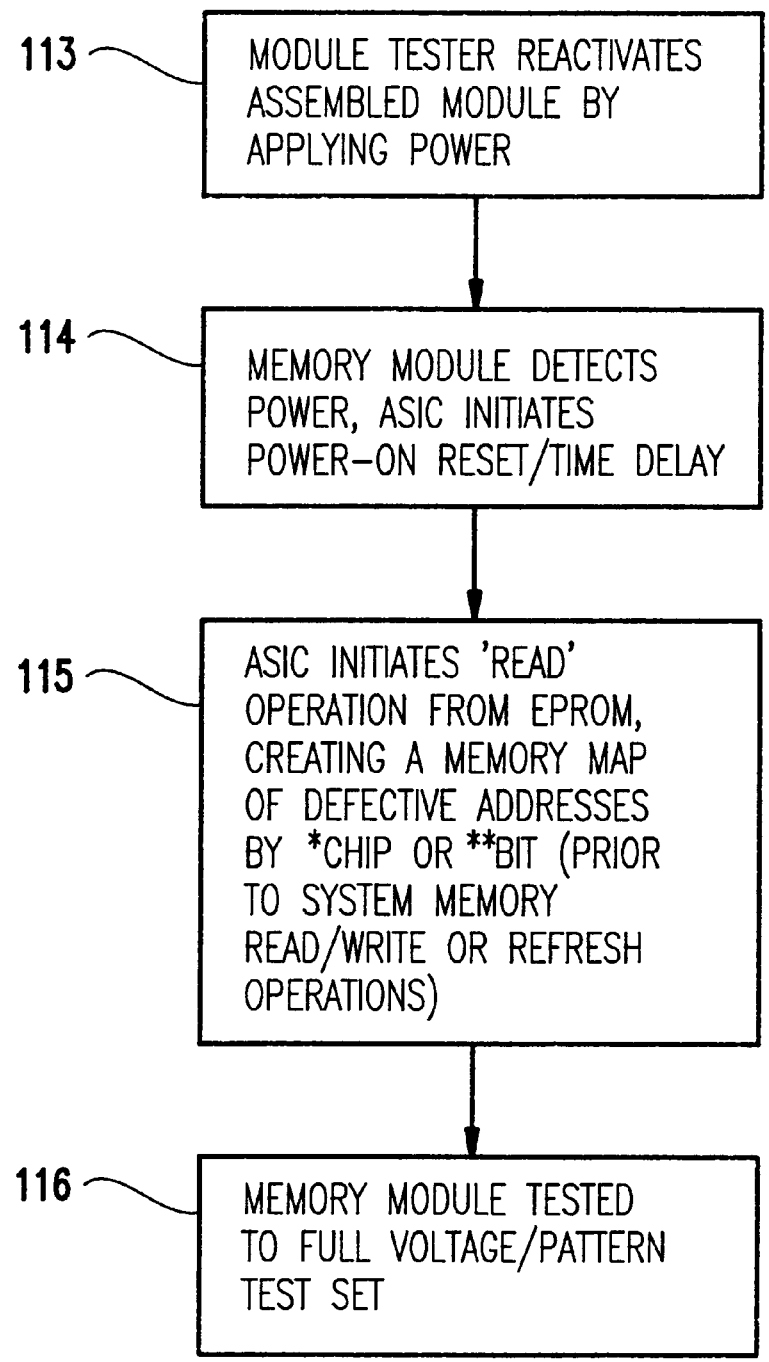
Figure 9E:
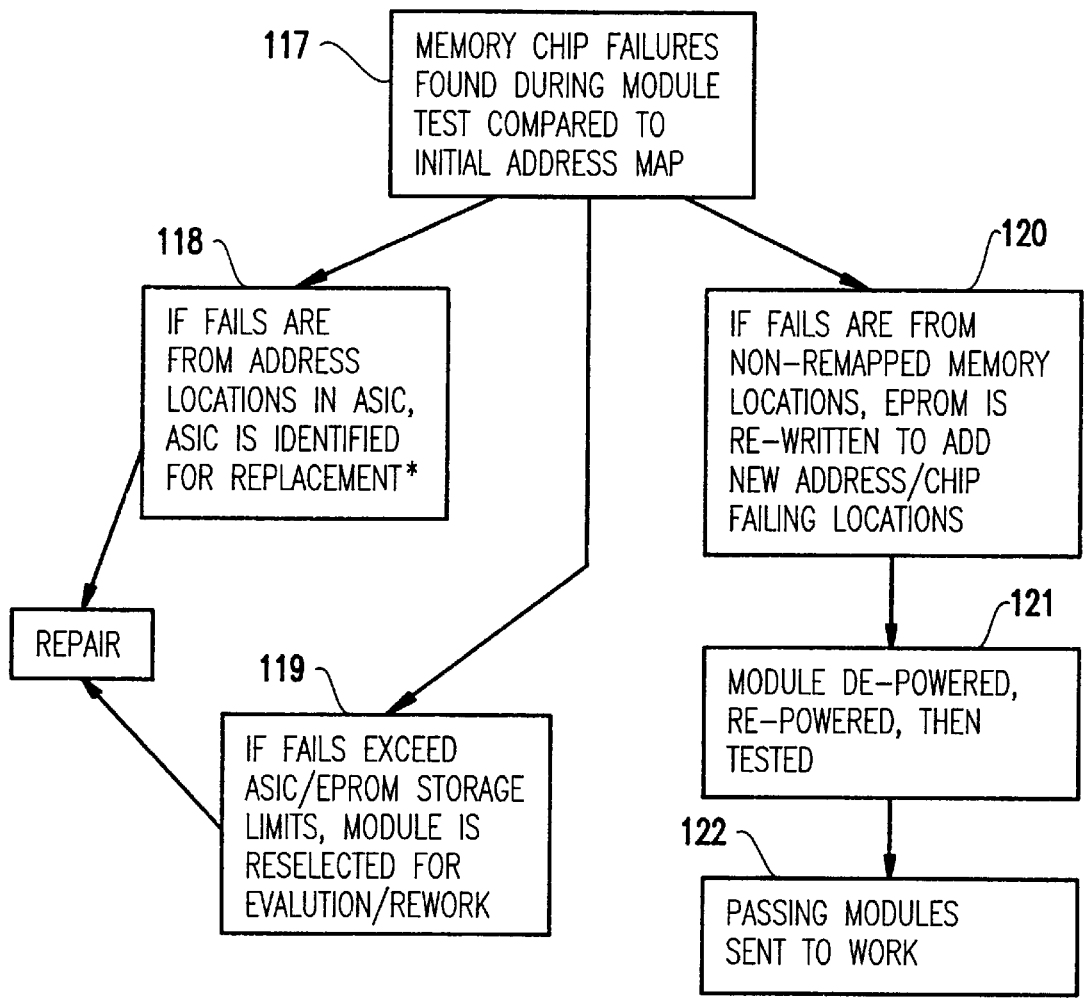

In FIGS. 9D and 9E, the process of module test is shown. Beginning in FIG. 9D, the module tester then re-activates the assembled module in function block 113. In response, the memory module detects power and the ASIC initiates power-on reset/time delay in function block 114. The ASIC then initiates a "read" operation from the EPROM, creating a memory map of the defective addresses by chip (4-bit boundary embodiment) or bit (single bit boundary embodiment), prior to system memory read/write or refresh operations in function block 115. The memory module is then tested in function block 116 to full voltage/pattern test set. The memory chip failures found during module test are compared to the initial address map in the EPROM in function block 117 at the top of FIG. 9E. If the fails are from address locations in the ASIC, the ASIC is identified for replacement in function block 118 and the module sent to repair. This could include re-mapping of the ASIC memory failures into alternate ASIC storage locations. If the fails exceed ASIC/EPROM storage limits, the module is rejected for evaluation and possible rework in function block 119 and the module sent to repair. If the fails are from non-remapped memory locations, the EPROM is re-written in function block 120 to add new address/chip failing locations. The module is de-powered and re-powered in function block 121 and re-tested. Passing modules are sent to stock in function block 122.

Figure 10A:
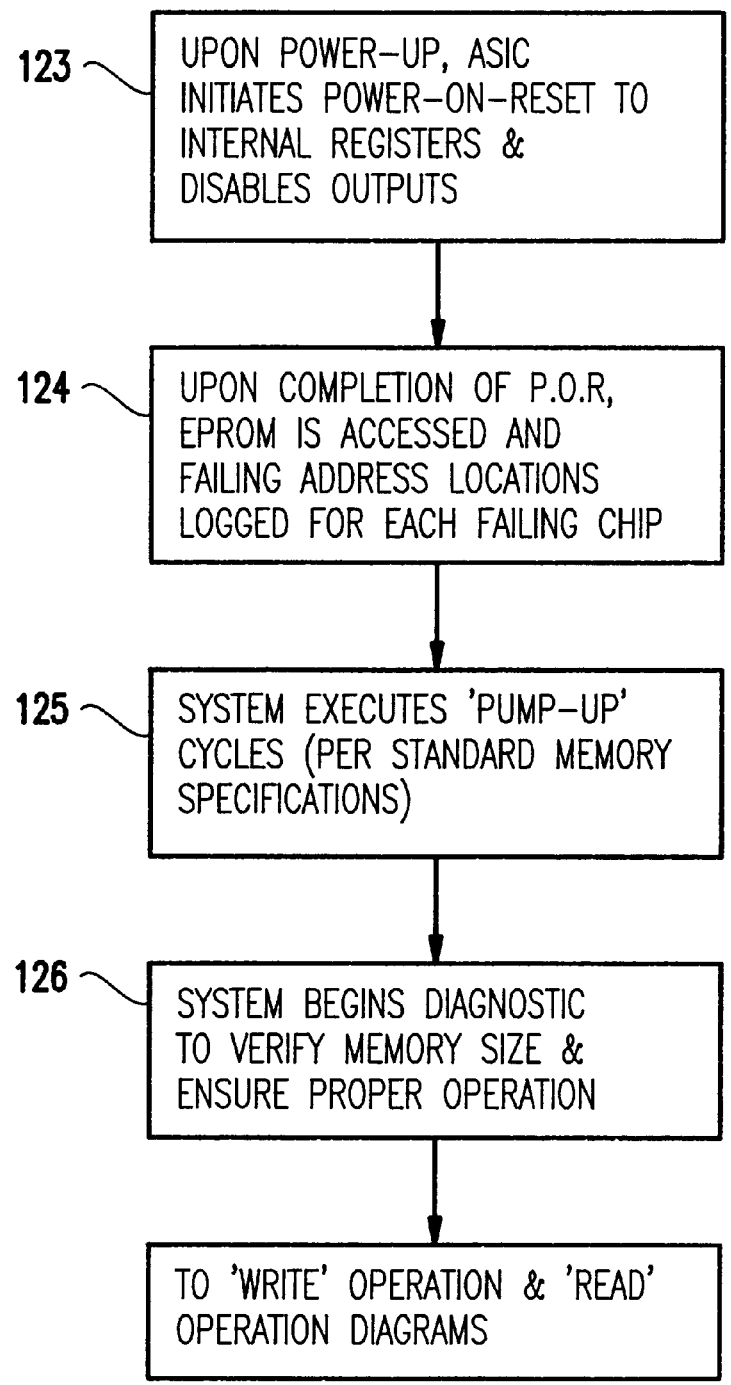
FIGS. 10A to 10C are flow diagrams showing the operation of the DRAM assembly.
Figure 10B:
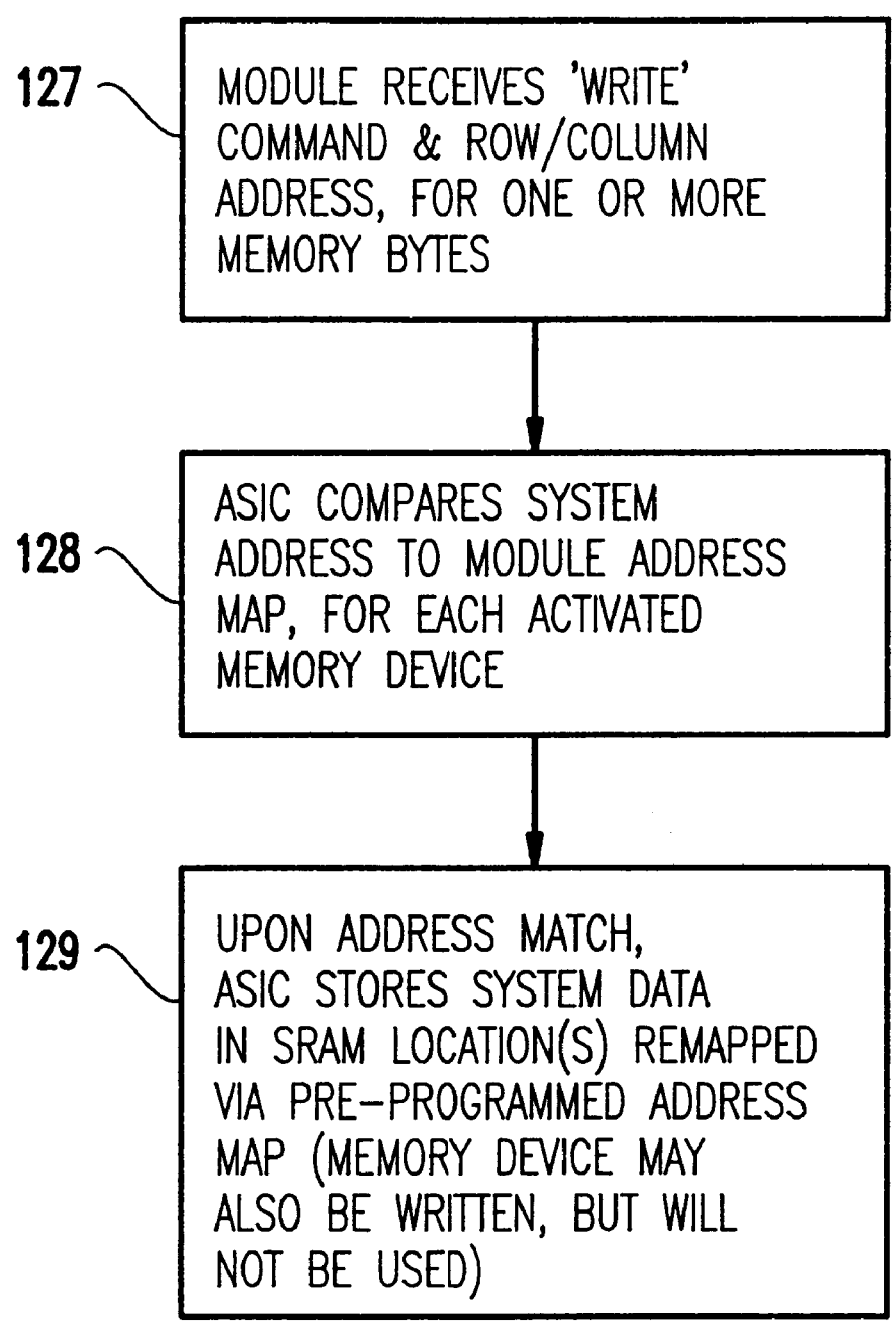
Figure 10C:
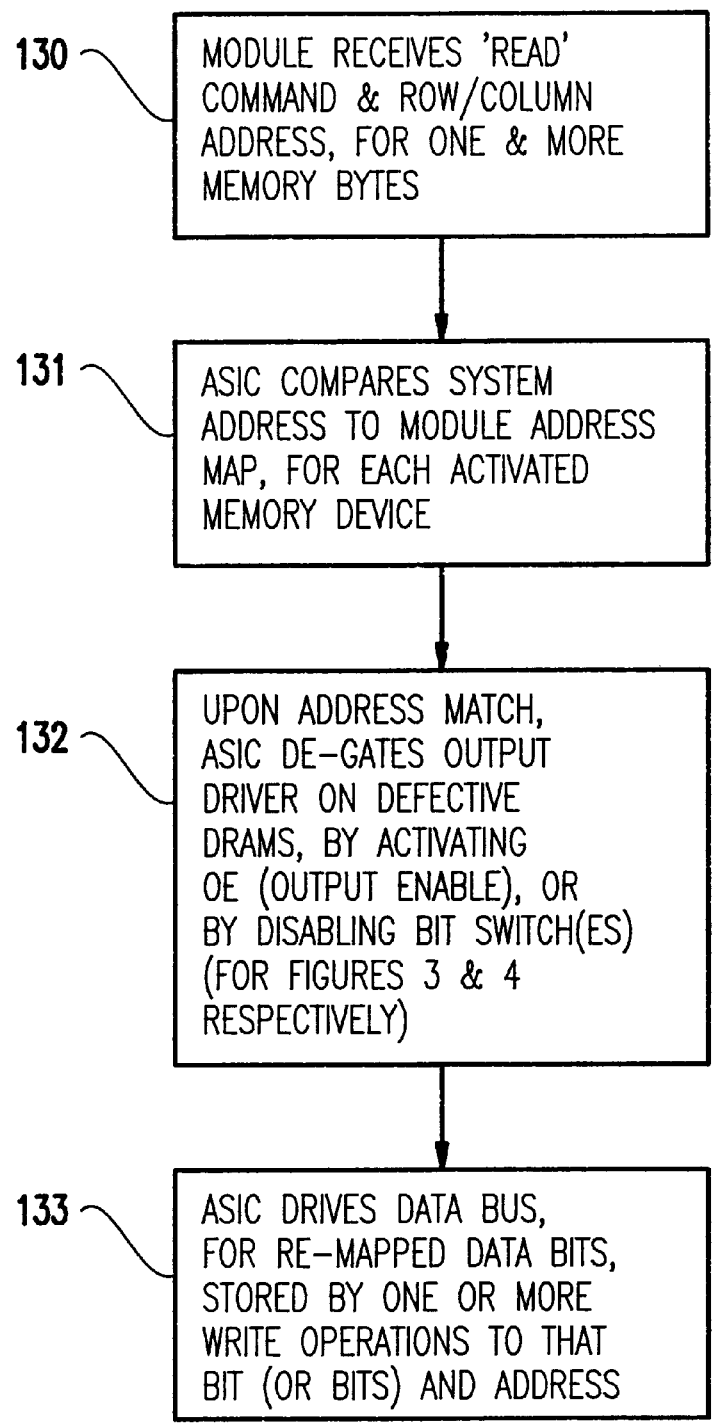

The process of ASIC operation is shown in FIGS. 10A to 10C. Beginning with FIG. 10A, on power-up, the ASIC initiates a power-on-reset to internal registers and disables outputs in function block 123. Upon completion of power-on-reset, the EPROM is accessed and failing address locations logged for each failing chip in function block 124. The system executes "pump-up" cycles, per standard memory specifications, in function block 125. Then the system begins a diagnostic routine in function block 126 to verify memory size and ensure proper operation, typically part of system power-on self test (POST). At this point, the module is ready to perform a "write" operation or a "read" operation.

The "write" operation is shown in FIG. 10B and begins with the a "write" command with row and column addresses for one or more memory bytes in function block 127. On each access, the ASIC compares the system address to module address map for each activated memory device in function block 128. Upon an address match, the ASIC stores system data in SRAM (or DRAM) location(s) re-mapped via the pre-programmed address map in function block 129. Note that the defective memory device will also be written, but it will not be used.

The "read" operation is shown in FIG. 10C and begins with a "read" command and row and column addresses for one or more memory bytes in function block 130. On each access, the ASIC compares the system address to module address map for each activated memory device in function block 131. Upon an address match, the ASIC de-gates the output driver on the defective DRAM(s) by activating output enable (4-bit boundary embodiment) or by disabling bit switches (single bit boundary embodiment) in function block 132. The ASIC drives the data bus for re-mapped data bits with data previously stored by one or more write operations to that bit (or bits) and address in function block 133. The ASIC deactivates the driver(s) upon the rise of the column address strobe on fast page mode modules or on the subsequent fall of the column address strobe or fall of the write enable signal (in EDO modules) or when RAS and CAS are both high (both modes).

To simplify logic and minimize EPROM size and ASIC remap size, entire word lines or bit lines in defective RAM(s) can be replaced. However, this will result in the largest amount of ASIC "RAM" being required. For a 16 Mb DRAM, addressed eleven rows and eleven columns, each re-mapped word line or bit line would require 2048 ASIC cells for each DRAM I/O being remapped.

Although two preferred embodiments have been described, the invention can be expanded to include alternate structures and implementations. For example, emerging structures such as EDO, Burst EDO (Pipelined Nibble), SDRAM, etc. all operate in a similar fashion to DRAM and can be used in the same manner. In the case of EDO, the ASIC would keep data active until the subsequent fall of CAS, as well as consistent with other control line combinations as described in the JEDEC (Joint Electron Devices Engineering Council of the Electronic Industries Association) standard for this function. This mode would be enabled via a control pin on the ASIC. In the case of BEDO, the ASIC would include a 4-bit burst address counter, programmable in interleave and sequential addressing modes. The operational characteristics would match the JEDEC standards. In the case of SDRAM, the ASIC would operate synchronously to the SDRAM clock, and again operate consistently with the JEDEC standard. The non-volatile memory device and SRAM memory would be further segmented to include support for multiple DRAM banks. Although the embodiment described is specific to DRAM structures, the same techniques can be applied to SRAM and other non-volatile memories.

Additional embodiments of the present invention may be envisioned, for example the invention may be used in conjunction with error checking and correction (ECC) logic, which is well known in the art or other techniques which are separate from the memory assembly. In an ECC application, any hard fails identified during read and write operations could be replaced by using a diagnostic routine identical to that used during SIMM test, previously described. As with normal production, the limiting factor is the size of the non-violative and violative (SRAM) arrays. In ECC applications, the use of this invention could result in significantly improved memory reliability as fails would be re-mapped continuously. If the volatile and non-volatile arrays were to be implemented in a memory controller, instead of on the memory module(s), the memory controller could replace failing memory locations on any installed memory modules. As with the ECC system implementation, the memory test and re-mapping of failures would be accomplished separate from the memory module(s) described in this invention. By replacing these bits, the likelihood of a catastrophic fail, due to multiple bit failures on a specific address, can be reduced exponentially. Additionally, one could use the "OE" pin to disable DRAM drivers (DQM for SDRAMS), rather than placing the ASIC in a data path. If the ASIC is in the data path, significant performance (access) degradation can occur, as well as result in timing violations between data (DQ) and control lines to the DRAM/SDRAM.

With increasing logic chip density, a CPU chipset could implement the "Dynamic Redundancy" internally, and re-map any fails located during "POST" (power-on self test). By doing so, the CPU could operate normally in spite of the existence of memory fails in one or more banks of memory modules, with no performance degradation, no human intervention, and minimal added complexity (to the chipset design). In this case, the ASIC may also include the non-volatile memory.

While the invention has been described in terms of preferred embodiments, those skilled in the art will recognize that the invention can be practiced with modification within the spirit and scope of the appended claims.

Having thus described our invention, what we claim as new and desire to secure by Letters Patent is as follows:

1. A dynamic random access memory (DRAM) assembly comprising:

one or more reduced specification DRAM chips mounted on a common carrier;

a non-volatile storage device mounted on said common carrier and storing address information for memory fails of the DRAM chips;

a logic device responsive to said non-volatile storage device and containing bit steering logic and timing generation logic which redirects defective addresses of the DRAM chips as derived from said address information to respective alternate storage addresses during at least one of a read operation and a write operation, and a bus switch connected between the reduced specification DRAM chips and a system bus and controlled by said logic device to allow substitution of an individual bit at one of said alternate storage addresses.

2. The DRAM assembly as recited in claim 1, further comprising:

a volatile storage device containing said alternate storage addresses into which the defective addresses of the DRAM chips are redirected by said bit steering logic and timing generation logic, and wherein the logic device and the volatile storage device are implemented in a single chip application specific integrated circuit (ASIC).

3. The DRAM assembly recited in claim 1 wherein the ASIC comprises:

a content addressable memory (CAM) receiving a row address and generating a match output when the row address matches data stored in the CAM, the CAM also generating a chip identification (ID) output;

a decoder and steering logic receiving said chip ID output and generating a signal to one of said reduced specification DRAM chips to inhibit an output;

a plurality of volatile storage arrays one of which is selected by said match output from the CAM, the volatile storage arrays receiving a column address for indexing into a row of a selected array; and a switch connected to receive outputs from the volatile storage arrays and the chip ID from the CAM, the switch selecting one of the volatile storage arrays for output to a system bus in response to the chip ID.

4. The DRAM assembly recited in claim 3 wherein the CAM further stores a "valid" bit, the "valid" bit and the match signal being used to select one of said volatile storage arrays.

5. The DRAM assembly recited in claim 3 wherein there are eight reduced specification DRAM chips, the CAM is a 16×11 array with a 4-bit tag, one bit of the 4-bit tag being the "valid" bit and three bits of the 4-bit tag being the chip ID, the decoder and steering logic decodes one of eight outputs to the DRAM chips, and the nonvolatile storage arrays are sixteen 2 K×4 fast static random access memory (SRAM) arrays.

6. The DRAM assembly recited in claim 3, wherein said ASIC controls said bus switch to allow substitution of an individual bit.

7. The DRAM assembly recited in claim 5 wherein there are eight reduced specification DRAM chips, the CAM is a 16×11 array with a 6-bit tag, one bit of the 6-bit tag being the "valid" bit, three bits of the 6-bit tag being the chip ID and two bits of the 6-bit tag being a bit ID, the decoder and steering logic further receives the bit ID and decodes one of thirty-two outputs to the bus switch, and the nonvolatile storage arrays are sixty-four 2 K×1 fast static random access memory (SRAM) arrays.

8. The DRAM assembly recited in claim 3 wherein said logic device is connected to or included in a memory controller which would locate and re-map failures anywhere in the memory space.

9. A method of assembling dynamic random access memory (DRAM) modules using one or more reduced specification DRAM chips comprising the steps of:

testing DRAM chips and logging locations of memory fails based on manufacturer identification (ID) information assigned to each of said DRAM chips;

placing DRAM chips on a common carrier using a mix of reduced specification DRAM chips;

mounting a non-volatile storage device on said common carrier;

storing in said non-volatile storage device address information for said memory fails logged for the DRAM chips mounted on the common carrier, said address information for said memory fails being stored in said non-volatile storage device based on the manufacturer ID information assigned to the DRAM chips;

mounting a logic device on the common carrier and connecting the logic device to the non-volatile storage device to redirect the addresses corresponding to the locations of said memory fails to alternate addresses for read and write operations; and mounting a volatile storage device on the common carrier to replace the addresses corresponding to the locations of said memory fails in the reduced specification DRAM chips, said volatile storage device containing said alternate addresses.

10. The method of assembly DRAM modules recited in claim 9 wherein the logic device and the volatile storage device are a single chip application specific integrated circuit (ASIC).

11. A DRAM assembly as recited in claim 1, further comprising error checking and correction (ECC) logic arranged to provide address information to said non-volatile storage device.

12. The method of claim 9, wherein said manufacturer ID information is a serial number uniquely assigned by a manufacturer to each of the DRAM chips.

13. A DRAM subsystem comprising:

one or more DRAM chips mounted on a common carrier, an error checking and correction circuit which identifies a memory fail in at least one of said one or more DRAM chips;

a non-volatile storage means for storing address information for said memory fail;

a logic circuit which, in response to said error checking and correction circuit, redirects a defective address corresponding to said address information to an alternate storage address for read and write operations;

a volatile storage device used to replace failing address locations on a continuous basis, said volatile storage device containing said alternate storage address; and a bus switch connected between said one or more DRAM chips and a system bus, said bus switch being controlled by said logic device to allow substitution of an individual bit at said alternate storage address.

14. The DRAM assembly recited in claim 13, further comprising:

an alternate storage device for replacing failing address locations in the DRAM chips, said alternate storage device including said alternate storage addresses.

15. The DRAM assembly recited in claim 14, wherein said alternate storage device is a volatile storage device mounted on said common carrier.

16. The DRAM assembly recited in claim 13, wherein said error checking and correction logic also identifies memory fails during a diagnostic routine performed during power-on testing of said assembly.

17. The DRAM assembly recited in claim 13, wherein, when said bit steering logic and timing generation logic redirects said defective addresses to said respective alternate storage addresses, said logic device inhibits the output of the one or more DRAM chips having the defective addresses.

18. The DRAM assembly recited in claim 13, wherein said logic circuit is mounted on said common carrier.

19. The DRAM assembly recited in claim 13, wherein said volatile storage device is mounted on said common carrier.

20. The DRAM assembly recited in claim 13, wherein said assembly is configured as a single inline memory module or a double inline memory module.

21. The method recited in claim 9, wherein said identification information corresponding to respective ones of DRAM chips is logged in said non-volatile storage device.

22. A memory assembly, comprising:

at least one memory device mounted on a carrier;

an error checking and correction circuit which identifies a memory fail in said memory device;

a non-volatile storage device which stores address information corresponding to the memory fail in said memory device, said non-volatile storage device being mounted on said carrier;

a logic device which, in response to said error checking and correction circuit, maps a defective address corresponding to said memory fail in said memory device to a replacement address when one of a read operation and a write operation is performed for the defective address in said memory device; and a bus switch connected between said at least one memory device and a system bus, said bus switch being controlled by said logic device to allow said defective address to be mapped to an individual bit at said replacement address.

23. The memory assembly recited in claim 22, further comprising:

a replacement storage device containing said replacement address.

24. The memory assembly recited in claim 23, wherein said replacement storage device is a volatile storage device mounted on said carrier.

25. The memory assembly recited in claim 22, wherein said logic device inhibits said memory device from outputting information when said logic device maps the defective address to the address in said replacement storage device.

26. The memory assembly recited in claim 22, wherein said logic device is mounted on said carrier.

27. The memory assembly recited in claim 22, wherein said replacement storage device is a volatile storage device.

28. The memory assembly recited in claim 22, wherein said memory assembly is configured as a single inline memory module or a double inline memory module.

29. The memory assembly recited in claim 22, wherein said memory device is one selected from a group consisting of a DRAM, an EDO, a Burst EDO (pipelined nibble), and an SDRAM.

30. The method of claim 9, wherein said DRAM chips are tested and the locations of said memory fails are logged during at least one predetermined stage during assembling of said dynamic access memory modules.

31. The method of claim 30, wherein said at least one predetermined stage includes at least one of a wafer stage, module stage, and burn-in stage.

32. The method of claim 8, wherein said testing, logging, placing, storing, and mounting steps are all performed by a manufacturer of the DRAM chips, and wherein said non-volatile storage device is also produced by said manufacturer.

33. The method of claim 8, further comprising:

mounting a bus switch between the DRAM chips and a system bus, said logic device controlling the bus switch to allow substitution of individual bits in the DRAM chips which have a data bit length greater than on bit.

* * * * *